United States Patent
Chiang et al.

(10) Patent No.: US 8,107,008 B2
(45) Date of Patent: Jan. 31, 2012

(54) METHOD AND SYSTEM OF AUTOMATICALLY CORRECTING A SAMPLING CLOCK IN A DIGITAL VIDEO SYSTEM

(75) Inventors: Yin-Ho Chiang, Tainan (TW); Shih-Chou Yang, Tainan (TW)

(73) Assignee: Himax Media Solutions, Inc., Tainan (TW)

( * ) Notice: Subject to any disclaimer, the term of this patent is extended or adjusted under 35 U.S.C. 154(b) by 394 days.

(21) Appl. No.: 12/510,242

(22) Filed: Jul. 27, 2009

(65) Prior Publication Data

US 2011/0019091 A1 Jan. 27, 2011

(51) Int. Cl.
*H03L 7/00* (2006.01)

(52) U.S. Cl. ............... 348/537; 348/540; 348/572

(58) Field of Classification Search ........... 348/537, 348/536, 540, 541, 572, 573; 345/204, 213, 345/98, 99; 341/111, 155; 375/362; *H03L 7/00; H03M 1/12*

See application file for complete search history.

(56) References Cited

U.S. PATENT DOCUMENTS

| | | | |
|---|---|---|---|
| 2007/0153126 A1* | 7/2007 | Sonobe | 348/537 |
| 2009/0196389 A1* | 8/2009 | Yamashita | 375/362 |

* cited by examiner

*Primary Examiner* — Sherrie Hsia
(74) *Attorney, Agent, or Firm* — Stout, Uxa, Buyan & Mullins, LLP

(57) ABSTRACT

A method and system of automatically correcting a sampling clock in a digital video system are disclosed. Sampling clocks with different phases are generated and subjected in turn to analog-to-digital conversion (ADC). A difference of at least a pair of neighboring data out of the ADC with respect to each phase is determined. A maximum difference is determined, and the sampling clock with the phase corresponding to the maximum difference is thus generated.

20 Claims, 9 Drawing Sheets

US 8,107,008 B2

METHOD AND SYSTEM OF AUTOMATICALLY CORRECTING A SAMPLING CLOCK IN A DIGITAL VIDEO SYSTEM

BACKGROUND OF THE INVENTION

1. Field of the Invention

The present invention generally relates to analog-to-digital conversion (ADC), and more particularly to automatically correcting a sampling clock phase or frequency in a digital system for performing ADC in a pixelated system.

2. Description of the Prior Art

When analog video signals are received and processed by a digital video system (also known as a pixelated system), such as a digital display or a graphics digitizer, the received analog video signals should be converted into a digital format before the signals are processed in digital domain. FIG. 1 is a block diagram illustrating an analog video source 10, such as a graphics card of a computer, and a digital video system 12, such as a liquid crystal display (LCD). The analog video source 10 provides analog video signals (e.g., analog RGB or YPbPr signals) to the digital video system 12 via a cable 14A. The received analog video signals are then converted into digital video signals by an analog-to-digital converter (ADC) 120. Along with the analog video signals are synchronization signals (e.g., a horizontal synchronization signal $H_{syn}$ and a vertical synchronization signal $V_{syn}$) provided via a cable 14B. The received synchronization signals are processed by a clock generator 122 in order to generate a sampling clock (or pixel clock), which is used to trigger conversion by the ADC 120.

Due to varying impedances and lengths of the cables 14A and 14B, the analog video signals and the synchronization signals may arrive at the digital video system 12 at slightly different times. In other words, the phase or even the frequency of the sampling clock controlling the ADC 120 may not be acceptably synchronized with the phase/frequency of the pixel clock for generating the analog video signals in the analog video source 10. As a result, the quality of the processed output (such as the display image) of the digital video system 12 may be compromised.

In order to resolve such drawbacks in the conventional digital video system, schemes have been developed, such as disclosed, for example, in U.S. Pat. No. 5,767,916, entitled "Method and Apparatus for Automatic Pixel Clock Phase and Frequency Correction in Analog to Digital Video Signal Conversion." This patent is directed to a technique of adjusting the pixel clock frequency by comparing the actual width of a video image with an expected image width. However, the technique may not accurately and effectively generate the pixel clock frequency in cases where the video image possesses substantial blank regions.

U.S. Pat. No. 6,268,848, entitled "Method and Apparatus Implemented in an Automatic Sampling Phase Control System for Digital Monitors," discloses a technique of controlling sampling phase by collecting digital samples of a horizontal line, followed by finding the peak value and the valley value.

U.S. Patent Application No. 2006/0274207, entitled "Method and Apparatus for Analog Graphics Sample Clock Frequency Verification," discloses a technique of automatically selecting the sampling frequency by measuring the difference between successive frames of images. However, the image data of an entire frame needs to be stored in order to measure the difference.

As a consequence of the above techniques not effectively or economically resolving the sampling clock phase/frequency problem, a need has arisen to propose a novel scheme that is capable of correcting sampling clock phase/frequency not only in an effective manner but also with minimum expenditure of resource and/or time.

SUMMARY OF THE INVENTION

In view of the foregoing, it is an object of the present invention to provide a method and system for effectively and economically correcting a phase and/or frequency of a sampling clock for the performance of analog-to-digital conversion (ADC).

According to one embodiment, sampling clocks at an expectant frequency with different phases are generated and provided in turn to an analog-to-digital converter (ADC). Sums of absolute differences (SADs) of neighboring data out of the ADC with respect to each phase are calculated. A maximum difference is determined, and the sampling clock with the phase corresponding to the maximum difference is thus generated.

According to another embodiment, sampling clocks at multiple candidate frequencies with different phases are generated and provided in turn to the ADC. SADs of neighboring data out of the ADC with respect to each phase and each candidate frequency are calculated. A maximum difference is determined, and the sampling clock with the phase and frequency corresponding to the maximum difference is thus generated.

DETAILED DESCRIPTION OF THE INVENTION

Figure 2:
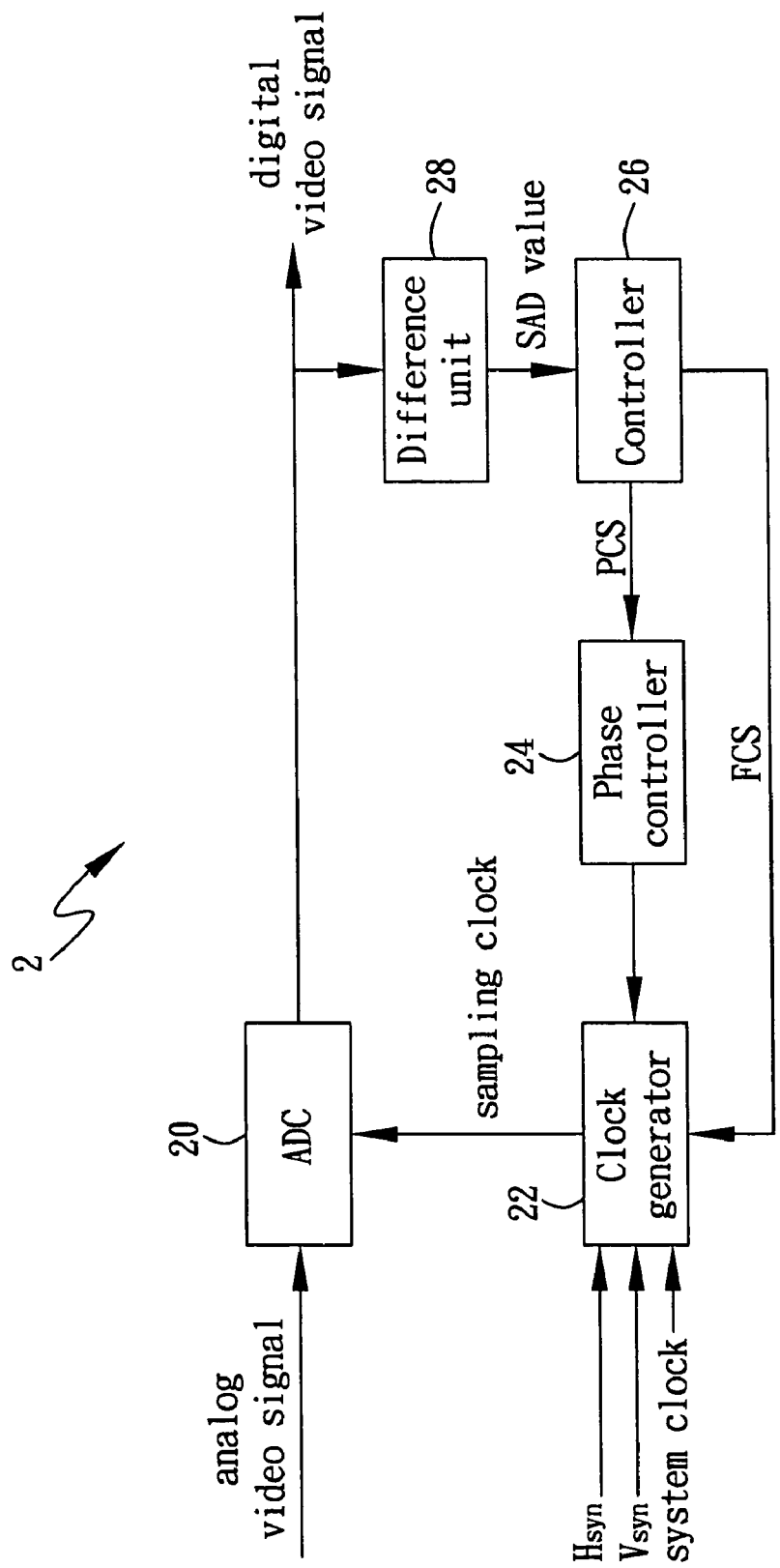
FIG. 2 is a block diagram illustrating a system for automatically correcting a sampling clock in a digital video system according to one embodiment of the present invention.
Figure 3:
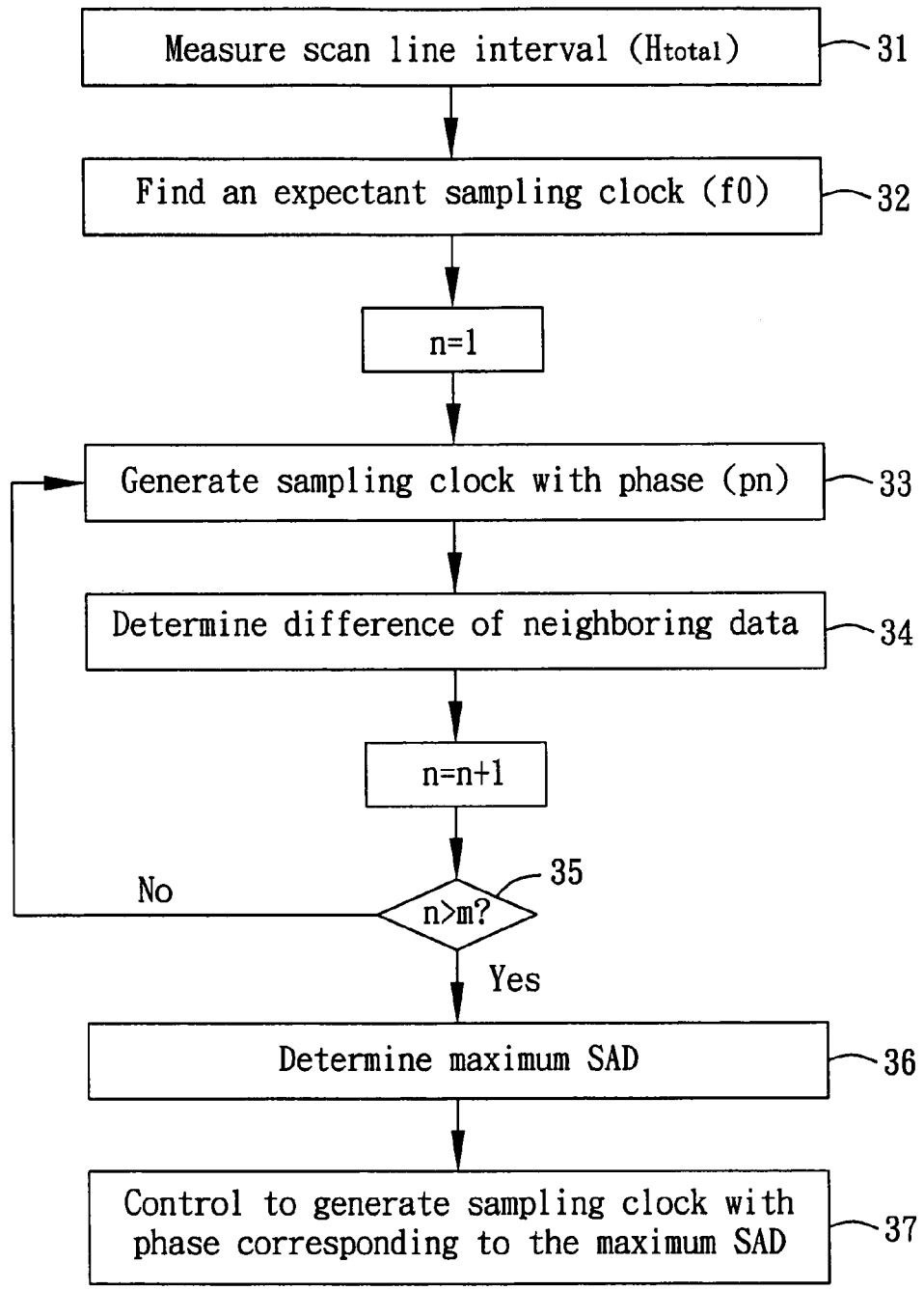
FIG. 3 is a flow chart illustrating a method of automatically correcting a sampling clock in a digital video system according to a first embodiment of the present invention.

FIG. 2 is a block diagram illustrating a system 2 for automatically correcting a sampling clock (or pixel clock) in a digital video system (also known as a pixelated system) according to one embodiment of the present invention. FIG. 3 is a flow chart illustrating a method of automatically correcting a sampling clock in a digital video system according to a first embodiment of the present invention. Although a digital display (e.g., a liquid crystal display (LCD)) is exemplified in the embodiment, any other compatible pixelated system, such as a graphics digitizer, may be well adopted.

Figure 1:
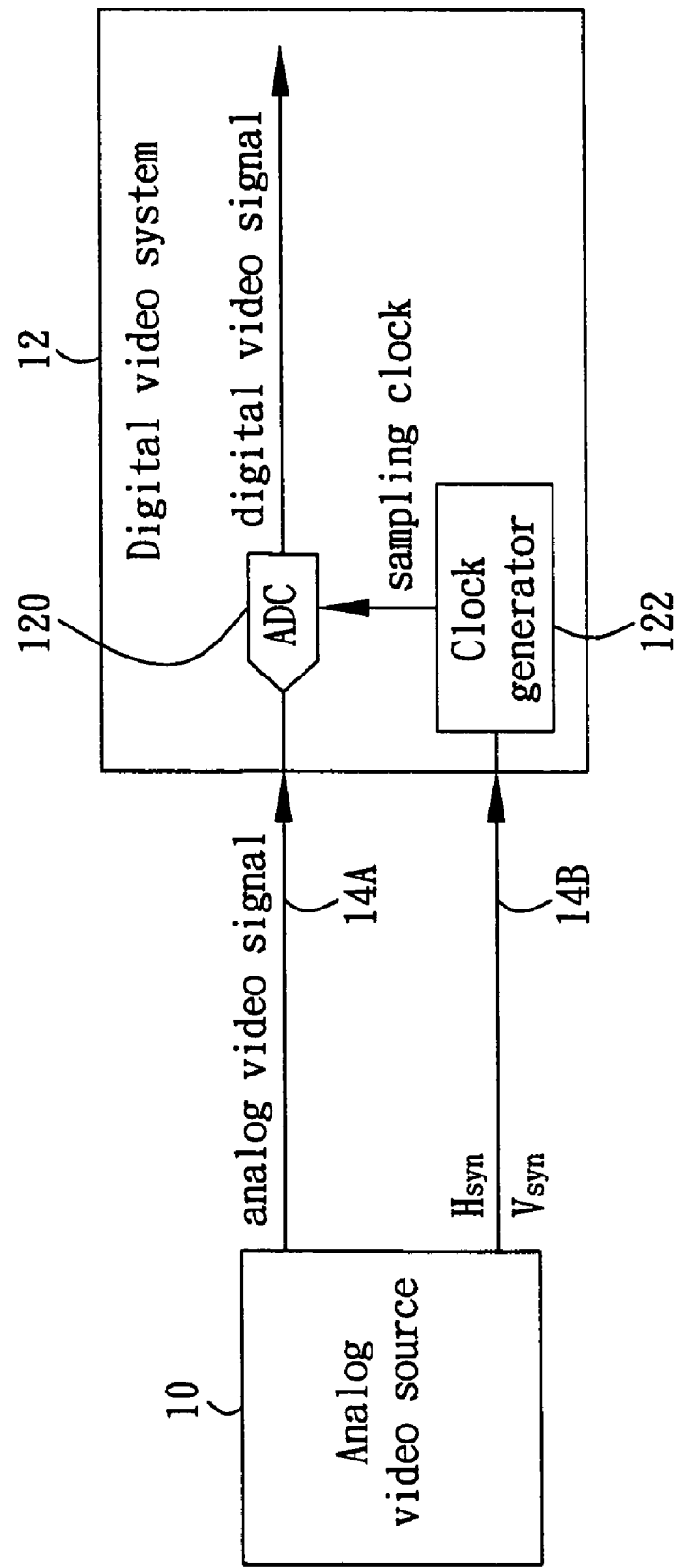
FIG. 1 is a block diagram illustrating an analog video source and a digital video system.

Referring to FIG. 2, an analog-to-digital converter (ADC) 20 receives an analog video signal from an analog video source (e.g., 10 in FIG. 1) such as a graphics card of a computer. The ADC 20 converts the analog video signal (e.g., an analog RGB or YPbPr signal) into a digital video signal.

Figure 4A:
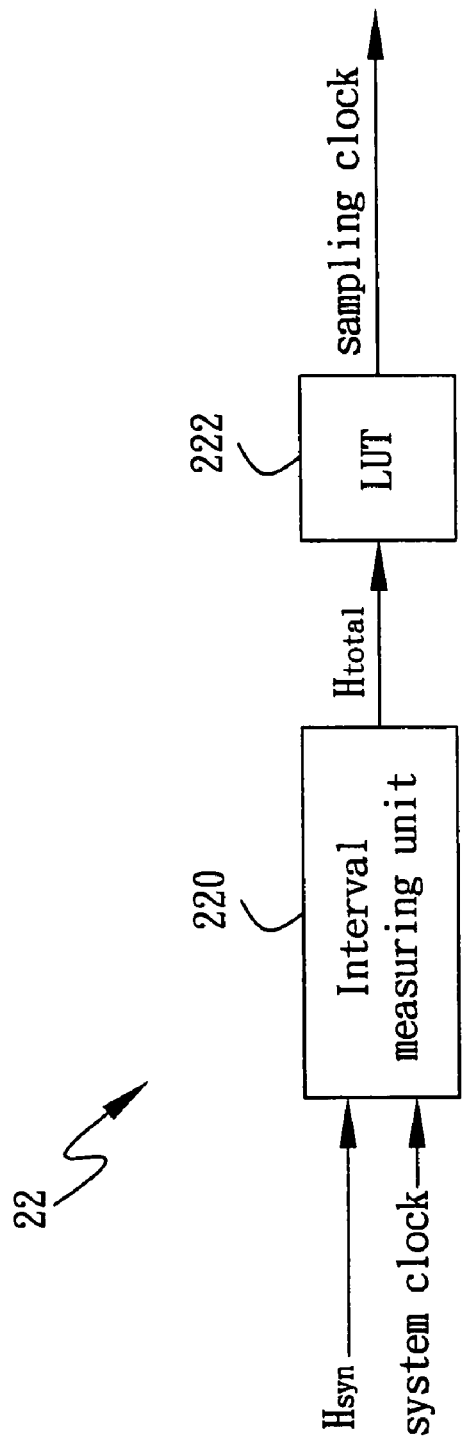
FIG. 4A shows a detailed block diagram of the clock generator according to an embodiment of the present invention.
Figure 4B:
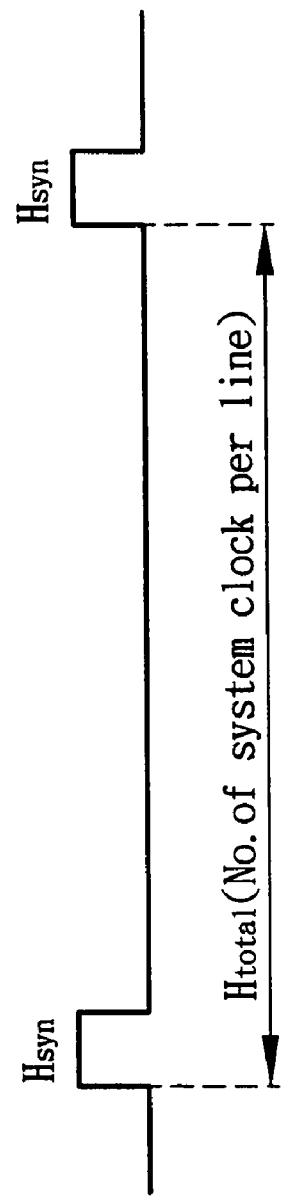
FIG. 4B shows a timing diagram exemplifying a scan line interval.

On the other hand, a clock generator 22 receives, from the analog video source, synchronization signals such as a horizontal synchronization signal $H_{syn}$ and a vertical synchronization signal $V_{syn}$. The clock generator 22 generates a sampling clock (or pixel clock) for triggering the ADC 20 based on the received synchronization signal (or signals) and a system clock of the system 2. FIG. 4A shows a detailed block diagram of the clock generator 22 according to the embodiment of the present invention. Specifically, the scan line interval, for example, in terms of the number of system clocks per line, is first measured by an interval measuring unit 220 (step 31, FIG. 3). FIG. 4B shows a timing diagram exemplifying a scan line interval $H_{total}$ beginning from the rising of a horizontal synchronization signal $H_{syn}$ until the rising of a subsequent horizontal synchronization signal $H_{syn}$. Afterwards, in step 32, the measured scan line interval $H_{total}$ is mapped to find a corresponding expectant sampling clock with frequency f0, for example, by a lookup table (LUT) 222. In the embodiment, the content of the LUT includes multiple scan line intervals and their corresponding sampling clocks with respective frequency. The content of the LUT 222 may be obtained empirically. In another embodiment, the respective sampling clocks may be mapped according to both the horizontal synchronization signal $H_{syn}$ and the vertical synchronization signal $V_{syn}$. It is appreciated by those skilled in the pertinent art that the interval measuring unit 220 and the LUT 222 may not necessarily be implemented inside the clock generator 22.

Figure 5:
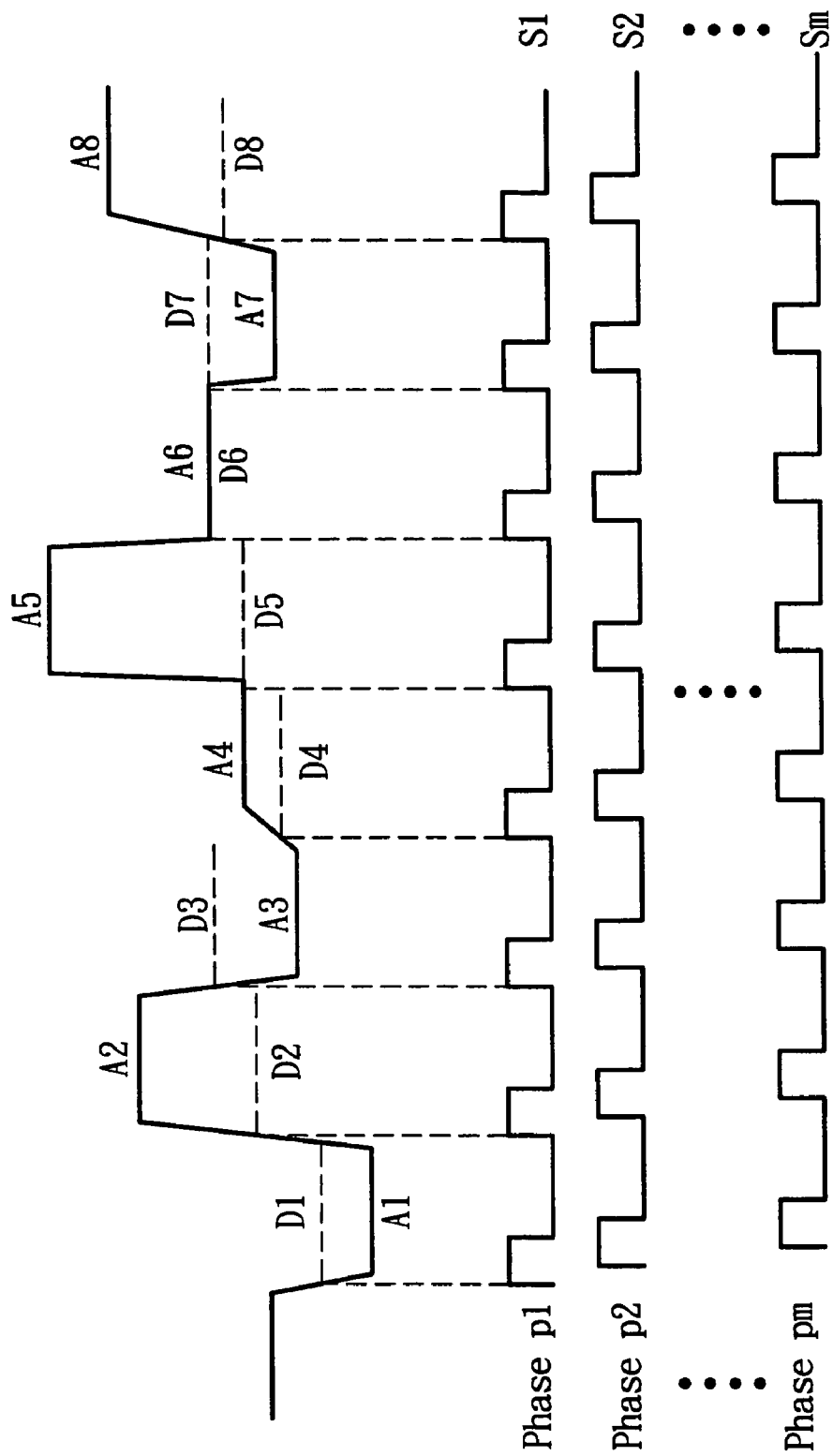
FIG. 5 shows a timing diagram of exemplary analog video signals and sampling clocks with different phases.

In the next step 33, the clock generator 22 generates and provides a number of sampling clocks (at the frequency f0) with different phases in turn to the ADC 20. The clock generator 22 generates the sampling clocks with different phases (e.g., phase p1, phase p2 . . . phase pm) based on phase information provided by a phase controller 24, which is controlled by a phase control signal PCS issued from a controller 26. FIG. 5 shows a timing diagram of exemplary analog video signals and sampling clocks with different phases p1-pm, with An representing the level of the analog video signal input to the ADC 20 and Dn representing the sampled data (or digital video signals) output from the ADC 20. This figure shows that the analog video signals are not correctly sampled by the phase p1.

Figure 6A:
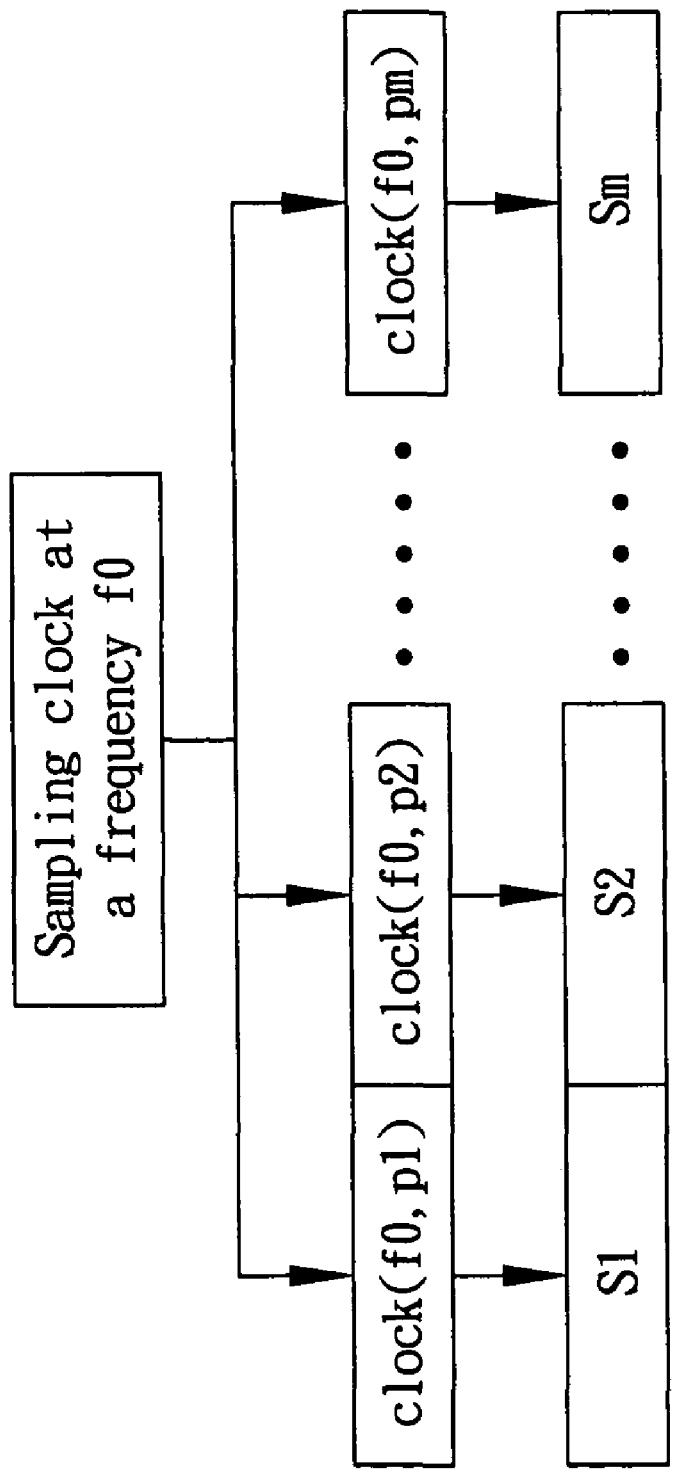
FIG. 6A shows SAD values calculated with respect to each phase.

Subsequently, with respect to each phase, the difference of at least a pair of neighboring data out of the ADC 20 is determined by a difference unit 28 (step 34). In one embodiment, sum Sn (n=1 to m) of absolute differences (SAD) between neighboring data in a (either partial or entire) scan line (or a field or a frame) is calculated with respect to each phase pn (n=1 to m) as shown in FIG. 6A. The SAD value S may be expressed as follows:

$$S = \sum_{i=1}^{k} |(D_{i+1} - D_i)|$$

where $D_i$ represents the i-th data in the scan line (or the field or the frame).

Figure 6B:
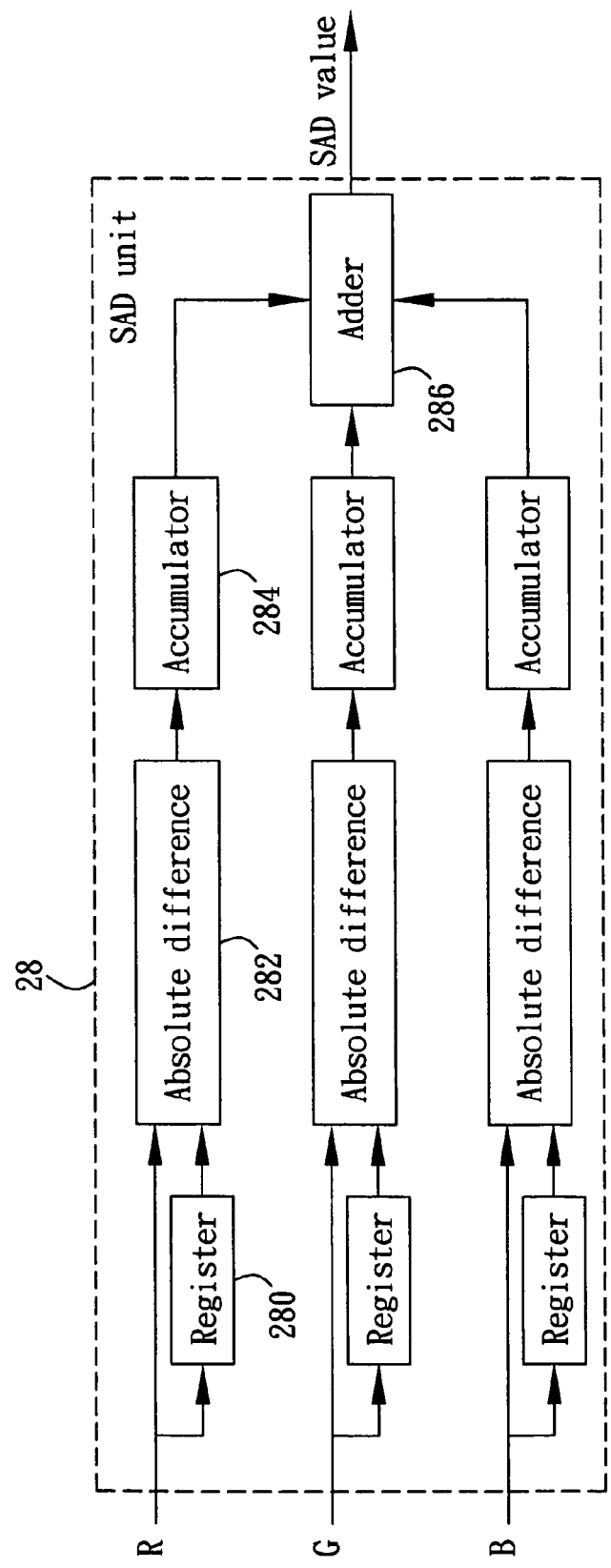
FIG. 6B shows a detailed block diagram of an SAD unit.

FIG. 6B is a detailed block diagram of the difference unit 28 for calculating the SAD values (or simply the "SAD unit") between neighboring R, G, B (red, green, blue) data. Specifically, the current data (e.g., R) and the preceding data that is stored in a register 280 are forwarded to an absolute difference unit 282 to calculate their absolute difference. The absolute difference is calculated and accumulated by an accumulator 284 successively along the scan line, thereby obtaining the sum of the absolute differences (SAD). The SAD values of different video components (e.g., R, G, B in this example) are then added up by an adder 286, resulting in the final SAD value Sn with respect to the phase pn. Although video data R, G, B are illustrated, it is appreciated that video data in one or more other color spaces (e.g., YUV) may be well adopted.

The calculated SAD values Sn are successively forwarded to the controller 26. After the data with respect to all phases (p1-pm) have been processed (step 35), the controller 26 determines the maximum SAD value (step 36). The controller 26 then issues a phase control signal PCS to control the phase controller 24, which controls shift amount of phase based on the phase control signal PCS, and then sends phase information to the clock generator 22 such that the phase of the sampling clock from the clock generator 22 corresponds to the maximum SAD (step 37). As the correctness of the phase is proportional to the SAD value, the sampling clock obtained in step 37, accordingly, may properly sample the analog video signals. Moreover, as the SAD is an extremely fast and simple metric, the sampling clock thus may be effectively and economically corrected.

Although the SAD is used in the embodiment discussed above, it is appreciated that one or more other difference metrics, such as sum of squared differences (SSD), may be adopted. Furthermore, not all SAD values are required to be calculated. For example, in another embodiment, one SAD value with respect to a phase (e.g., the middle phase p3) is calculated. If the calculated SAD value is greater than a predetermined reference, the phase of the sampling clock is corrected to the phase corresponding to the current SAD; otherwise, an SAD value with respect to another phase is further calculated. This procedure is continued, for example, in a binary search manner, until the calculated SAD value is greater than the predetermined reference.

Figure 7:
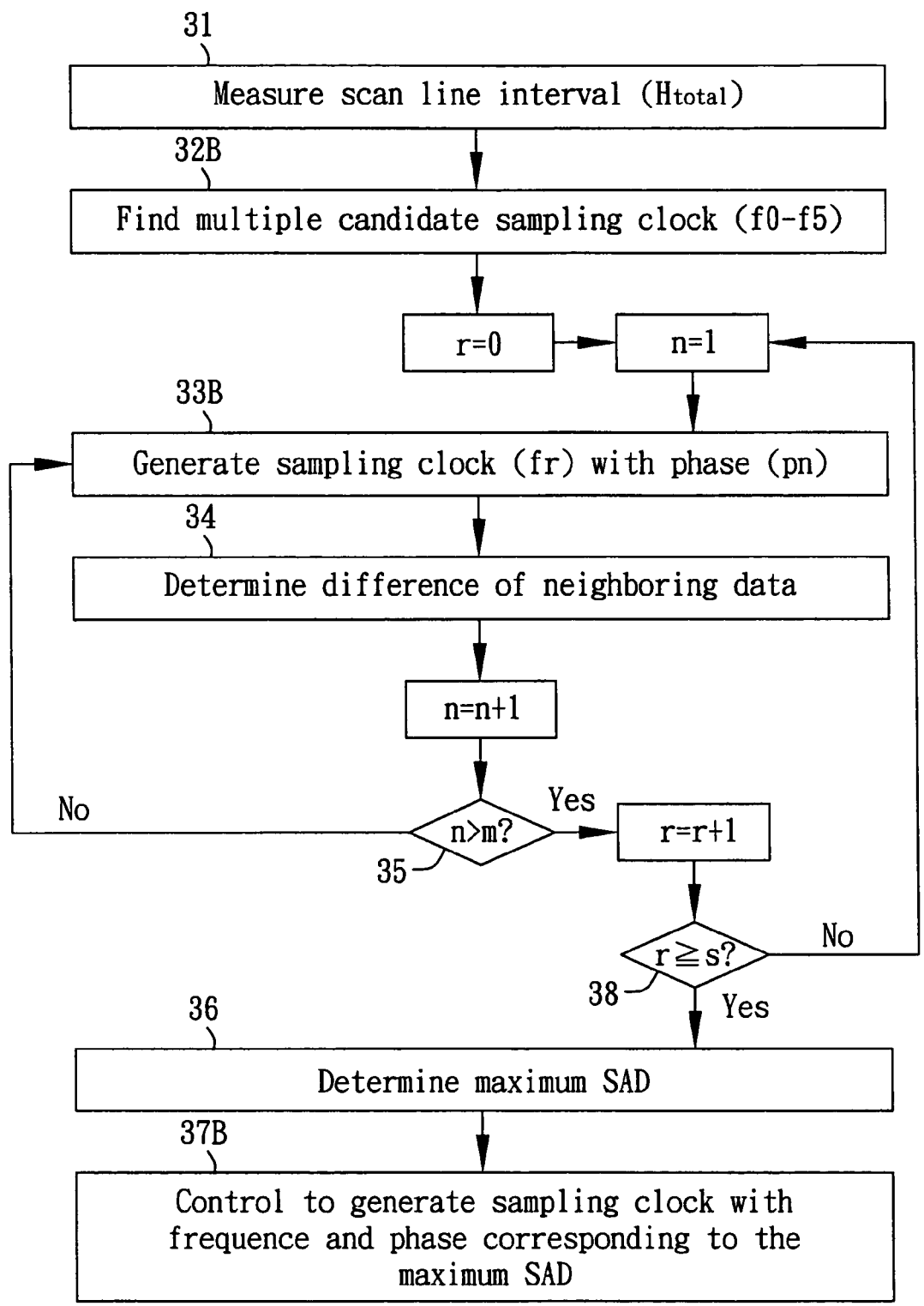
FIG. 7 is a flow chart illustrating a method of automatically correcting a sampling clock in a digital video system according to a second embodiment of the present invention.

FIG. 7 is a flow chart illustrating a method of automatically correcting a sampling clock in a digital video system according to a second embodiment of the present invention. The present embodiment (FIG. 7) is similar to the first embodiment (FIG. 3) except for the following aspects. In the present (second) embodiment, after the scan line interval $H_{total}$ is measured (step 31), multiple candidate frequencies fr (r=0 to s−1) (e.g., six candidate frequencies f0 to f5) are mapped (step 32B).

Figure 8:
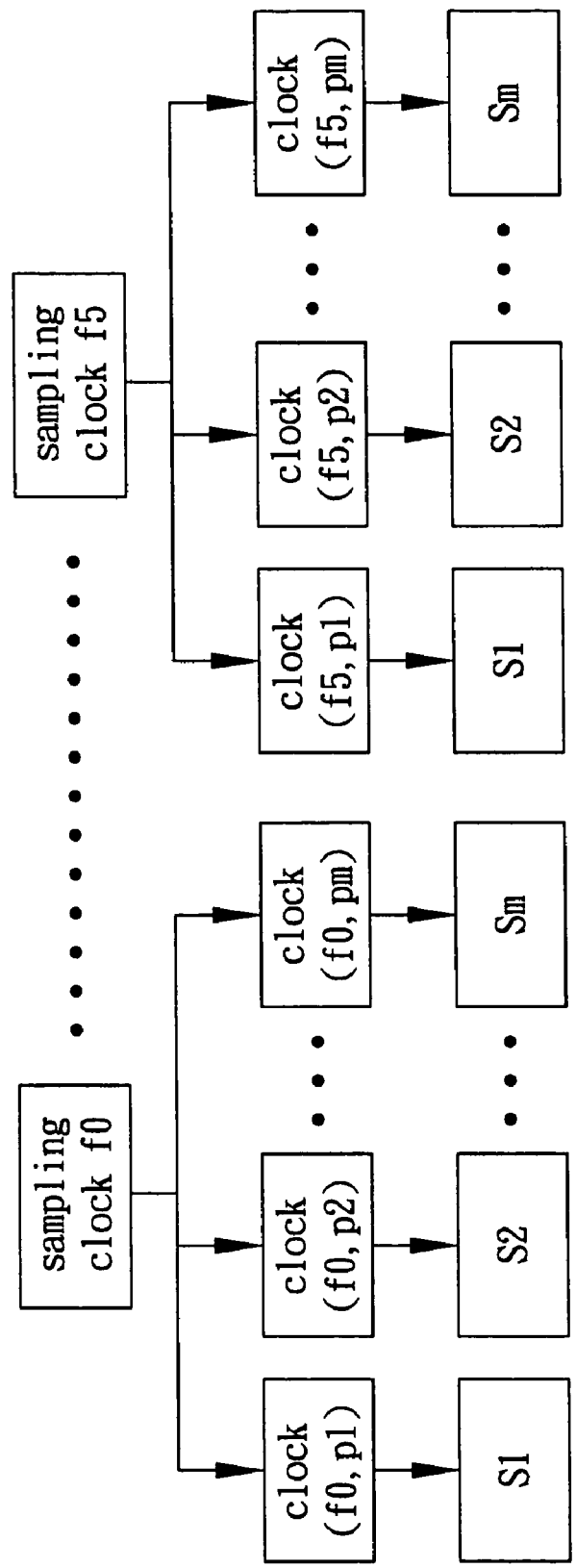
FIG. 8 shows SAD values calculated with respect to each candidate frequency and phase.

The clock generator 22 generates a number of sampling clocks, first, at a frequency f0 with different phases for provision in turn to the ADC 20. Subsequently, the clock generator 22 generates a number of sampling clocks at another frequency f1 with different phases in turn. This procedure continues until the sampling clocks of all candidate frequencies are generated successively (step 38) as shown in FIG. 8.

After the maximum one among all SAD values is determined (step 36), the controller 26 issues a phase control signal PCS to control the phase controller 24, which sends phase information to the clock generator 22. The controller 26 also issues a frequency control signal FCS to control the clock generator 22. As a result, the phase and the frequency of the sampling clock from the clock generator 22 correspond to the maximum SAD (step 37B). Accordingly, the sampling clock obtained in step 37B may properly sample the analog video signals.

Although specific embodiments have been illustrated and described, it will be appreciated by those skilled in the art that various modifications may be made without departing from the scope of the present invention, which is intended to be limited solely by the appended claims.

What is claimed is:

1. A method of automatically correcting a sampling clock in a digital video system, the method comprising:
   generating the sampling clock, which is used to trigger analog-to-digital conversion (ADC);
   generating a plurality of sampling clocks with different phases in turn;
   determining a difference of at least a pair of neighboring data from the ADC with respect to each of the phases;
   determining a maximum one of the differences; and
   generating the sampling clock with the phase corresponding to the maximum difference;
   wherein the generating of the sampling clock comprises:
   measuring scan line interval according to a synchronization signal and a system clock; and
   finding at least one frequency for the sampling clock according to the measured scan line interval.

2. The method of claim 1, wherein the digital video system is a digital display.

3. The method of claim 1, wherein the synchronization signal is a horizontal synchronization signal.

4. The method of claim 1, wherein one expectant frequency is found for the sampling clock.

5. The method of claim 4, wherein sum of absolute differences between the neighboring data in at least a partial scan line is calculated with respect to each of the phases.

6. The method of claim 1, wherein a plurality of candidate frequencies are found for the sampling clock.

7. The method of claim 6, wherein the differences are determined further with respect to each of the candidate frequencies.

8. The method of claim 7, wherein the sampling clock is generated further with the frequency corresponding to the maximum difference.

9. The method of claim 6, wherein sum of absolute differences between the neighboring data in at least a partial scan line is calculated with respect to each of the phases and each of the candidate frequencies.

10. A system for automatically correcting a sampling clock in a digital video system, the system comprising:
    an analog-to-digital converter (ADC) for converting an analog video signal into a digital video signal;
    a clock generator for generating the sampling clock according to a synchronization signal and a system clock, wherein a plurality of sampling clocks with different phases are generated in turn and forwarded to the ADC;
    a difference unit for determining a difference of at least a pair of neighboring data out of the ADC with respect to each of the phases; and
    a controller for determining a maximum one of the differences and then controlling the clock generator to generate the sampling clock with the phase corresponding to the maximum difference;
    wherein the clock generator comprises:
    an interval measuring unit for measuring scan line interval according to the synchronization signal and the system clock; and
    a lookup table for mapping the measured scan line interval to find at least one frequency for the sampling clock according to the measured scan line interval.

11. The system of claim 10, wherein the digital video system is a digital display.

12. The system of claim 10, wherein the synchronization signal is a horizontal synchronization signal.

13. The system of claim 10, wherein one expectant frequency is found for the sampling clock.

14. The system of claim 13, wherein the difference unit is a sum of absolute difference (SAD) unit, which calculates sum of absolute differences between the neighboring data in at least a partial scan line with respect to each of the phases.

15. The system of claim 10, wherein a plurality of candidate frequencies are found for the sampling clock.

16. The system of claim 15, wherein the differences are determined further with respect to each of the candidate frequencies.

17. The system of claim 16, wherein the controller further issues a frequency control signal to control the clock generator.

18. The system of claim 17, wherein the sampling clock is generated further with the frequency corresponding to the maximum difference.

19. The system of claim 15, wherein the difference unit is a sum of absolute difference (SAD) unit, which calculates sum of absolute differences between the neighboring data in at least a partial scan line with respect to each of the phases and each of the candidate frequencies.

20. The system of claim 10, further comprising a phase controller for controlling shift amount of phase by providing phase information to the clock generator according to a phase control signal issued by the controller.

* * * * *